(12) United States Patent
Dimitrov et al.

(10) Patent No.: US 8,277,877 B1
(45) Date of Patent: Oct. 2, 2012

(54) METHOD FOR APPLYING PROTECTIVE LASER FACET COATINGS

(75) Inventors: Roman Dimitrov, San Jose, CA (US); Ashish Verma, San Jose, CA (US); Tsurugi Sudo, San Jose, CA (US); Scott Lehmann, Oakland, CA (US)

(73) Assignee: Finisar Corporation, Sunnyvale, CA (US)

( * ) Notice: Subject to any disclaimer, the term of this patent is extended or adjusted under 35 U.S.C. 154(b) by 1040 days.

(21) Appl. No.: 11/749,052

(22) Filed: May 15, 2007

Related U.S. Application Data

(60) Provisional application No. 60/747,298, filed on May 15, 2006.

(51) Int. Cl.
*B05D 5/06* (2006.01)

(52) U.S. Cl. ........ 427/162; 427/209; 427/471; 427/596; 372/49.01; 118/730

(58) Field of Classification Search .................. 427/162, 427/471, 596, 209; 372/49.01
See application file for complete search history.

(56) References Cited

U.S. PATENT DOCUMENTS

| | | | |
|---|---|---|---|
| 4,092,659 A | 5/1978 | Ettenberg | |
| 4,740,987 A | 4/1988 | McCall et al. | |
| 4,859,628 A | 8/1989 | Knight et al. | |
| 4,951,292 A | 8/1990 | Kuindersma et al. | |
| 5,208,821 A | 5/1993 | Berger et al. | |
| 5,450,432 A | 9/1995 | Okuda | |
| 5,675,601 A | 10/1997 | Karakida et al. | |
| 5,793,787 A | 8/1998 | Meyer et al. | |
| 6,037,006 A * | 3/2000 | Chakrabarti et al. | ......... 427/294 |
| 6,219,366 B1 | 4/2001 | Furushima | |
| 6,618,410 B1 | 9/2003 | Fischer et al. | |
| 2002/0037024 A1 | 3/2002 | Huang | |
| 2002/0114367 A1 | 8/2002 | Stintz et al. | |

(Continued)

FOREIGN PATENT DOCUMENTS

JP 2000-340894 12/2000
(Continued)

OTHER PUBLICATIONS

Sexl, M., Bohm G., Maier, M., Tranke, G., Weimann, G., & Abstreiter, G. (1997), MBE Growth of Metamorphic In(Ga)AlAs Buffers. 1997 IEEE International Symposium on Compound Semiconductors, IEEE, 49-52.

(Continued)

*Primary Examiner* — Timothy Meeks
*Assistant Examiner* — Elizabeth Burkhart
(74) *Attorney, Agent, or Firm* — Maschoff Gilmore & Israelsen

(57) ABSTRACT

A method for depositing protective coatings on front and rear facets of an optical device, such as a laser die, is disclosed. The protective coatings help prevent laser facet damage common to laser dies manufactured using known processes. In one embodiment, the method for coating the laser die includes placing the laser in an evacuated coating chamber before applying a first coating portion to a first facet of the laser. The first coating portion is applied to the first facet so as to form a protective covering thereon, but is applied at a coating energy that minimizes damage to the as-yet uncoated second facet. The laser is then rotated within the coating chamber, and a full coating is applied to a second facet of the laser. The laser is again rotated, and a full coating is applied atop the first coating portion to the first facet of the laser.

20 Claims, 5 Drawing Sheets

U.S. PATENT DOCUMENTS

| | | | |
|---|---|---|---|
| 2002/0117675 A1 | 8/2002 | Mascarenhas | |
| 2002/0155631 A1* | 10/2002 | Saitoh et al. | 438/22 |
| 2003/0002557 A1 | 1/2003 | Eng et al. | |
| 2003/0179795 A1 | 9/2003 | Moriya et al. | |
| 2004/0079967 A1 | 4/2004 | Shakuda et al. | |
| 2004/0086017 A1 | 5/2004 | Yoshida et al. | |
| 2004/0190835 A1 | 9/2004 | Burdick et al. | |
| 2005/0000451 A1* | 1/2005 | Mitsui et al. | 118/728 |
| 2005/0031000 A1 | 2/2005 | Botez | |

FOREIGN PATENT DOCUMENTS

JP        2003-183824    *    7/2003

OTHER PUBLICATIONS

Sudo, Tsurugi, et al., Semiconductor Laser Having Low Stress Passivation Layer, U.S. Appl. No. 11/749,047, filed May 15, 2007.

Ha, Yuk Lung, et al., Epitaxial Regrowth in a Distributed Feedback Laser, U.S. Appl. No. 11/749,007, filed May 15, 2007.

Verma, Ashish K., et al., Thin INP Spacer Layer in a High Speed Laser for Reduced Lateral Current Spreading, U.S. Appl. No. 11/749,033, filed May 15, 2007.

Dimitrov, Roman, et al., High Resistivity Engineered Laser Facet Coatings, U.S. Appl. No. 11/749,057, filed May 15, 2007.

Dimitrov, Roman, et al., Laser Facet Pre-Coating Etch for Controlling Leakage Current, U.S. Appl. No. 11/749,061, filed May 15, 2007.

Young, David Bruce, et al., Semiconductor Laser Having a Doped Active Layer, U.S. Appl. No. 11/749,013, filed May 15, 2007.

U.S. Appl. No. 11/749,013, Oct. 29, 2008, Office Action.

U.S. Appl. No. 11/749,013, Feb. 25, 2009, Notice of Allowance.

U.S. Appl. No. 11/749,047, Aug. 12, 2008, Office Action.

U.S. Appl. No. 11/749,047, Feb. 6, 2009, Notice of Allowance.

U.S. Appl. No. 11/749,033, Jun. 2, 2008, Office Action.

U.S. Appl. No. 11/749,033, Jan. 13, 2009, Notice of Allowance.

U.S. Appl. No. 11/749,007, Dec. 9, 2008, Office Action.

U.S. Appl. No. 11/749,057, Dec. 11, 2008, Office Action.

* cited by examiner

METHOD FOR APPLYING PROTECTIVE LASER FACET COATINGS

CROSS-REFERENCE TO RELATED APPLICATIONS

This application claims the benefit of the U.S. Provisional Patent Application No. 60/747,298, filed May 15, 2006, and entitled "METHOD FOR APPLYING PROTECTIVE LASER FACET COATINGS," which is incorporated herein by reference in its entirety.

BACKGROUND

1. Technology Field

The present invention generally relates to semiconductor optical devices. In particular, the present invention relates to a method for applying coatings to facets of a laser device so as to protect the facets from damage during the coating process.

2. The Related Technology

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A grating is included in either the top or bottom layer to assist in producing a coherent light beam in the active region. The coherent stream of light that is produced in the active region can be emitted through either longitudinal end, or facet, of the laser body. DFB lasers are typically known as single mode devices as they produce light signals at one of several distinct wavelengths, such as 1,310 nm or 1,550 nm. Such light signals are appropriate for use in transmitting information over great distances via an optical communications network.

The two facets of the DFB laser described above are typically coated with a coating material that optimizes the emission of light from the active region. During a typical coating process, the laser is placed in a coating chamber, which is then evacuated. A full coating is then applied to a first facet of the laser before the vacuum in the chamber is released, the laser is rotated 180 degrees, and a full coating applied to the second facet.

One challenge with known coating processes such as the one described above relates to the second facet, which remains uncoated and unprotected during the full coating phase of the first facet. Due to the plasma environment found in the coating chamber during the coating process, damage may occur to the second facet while the first facet coating process is carried out, a process that can last from two to ten hours or more. Damage to the second facet in this manner can result in a substantial reduction in yield during laser manufacture.

Damage to the second facet similar to that just described can also occur in other coating processes, such as e-beam evaporation procedures, which are typically executed at elevated temperatures. Commonly performed at a deposition temperature of 150-200 degrees Celsius, the e-beam evaporation process is typically such that the second facet of the laser remains exposed for a prolonged period of time, undesirably allowing damage thereto to occur.

In light of the above discussion, therefore, a need exists in the art for a method by which facets of a laser, such as a DFB laser, can be spared from damage during the facet coating process, thereby increasing laser yield and improving overall laser performance.

BRIEF SUMMARY

The present invention has been developed in response to the above and other needs in the art. Briefly summarized, embodiments of the present invention are directed to a method for depositing protective coatings on front and rear facets of an optical device, such as a laser die. The protective coatings help prevent laser facet damage common to laser dies manufactured using known processes.

In one embodiment, the method for coating the laser die includes placing the laser in an evacuated coating chamber before applying a first coating portion to a first facet of the laser. The first coating portion is applied to the first facet so as to form a protective covering thereon, but is applied at a coating energy that minimizes damage to the as-yet uncoated second facet. The laser is then rotated within the coating chamber, and a full coating is applied to a second facet of the laser. The laser is again rotated, and a full coating is applied atop the first coating portion to the first facet of the laser.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which is generally directed to a method for applying coatings to the facets of a laser, such as a distributed feedback or Fabry-Perot laser in such a way as to protect the facets from damage during the laser fabrication process.

Note at the outset that the discussion to follow regarding embodiments of the present invention should not be construed as limiting the application to such embodiments. Indeed, devices and components apart from optical transmitters and transceiver modules that employ laser devices and other suitable light sources can also benefit from the teachings to be discussed herein. Moreover, the principles of the present invention can apply to lasers of various types and configurations, including DFB, FP, etc., as well as to other faceted optical components.

1. Exemplary Operating Environment

Figure 1:
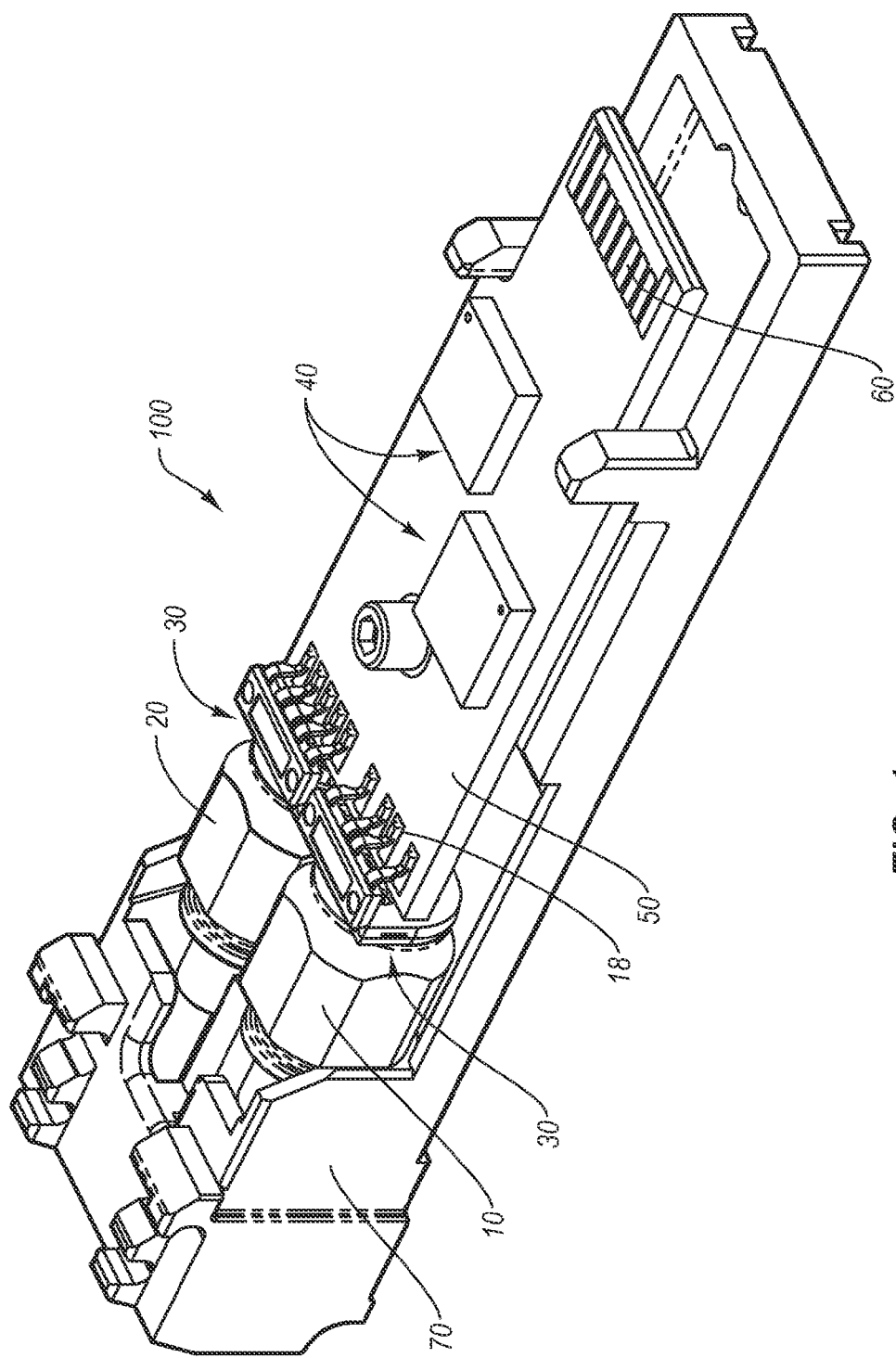
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber (not shown) operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

2. Aspects of a Method for Applying Laser Facet Coatings

Figure 2:
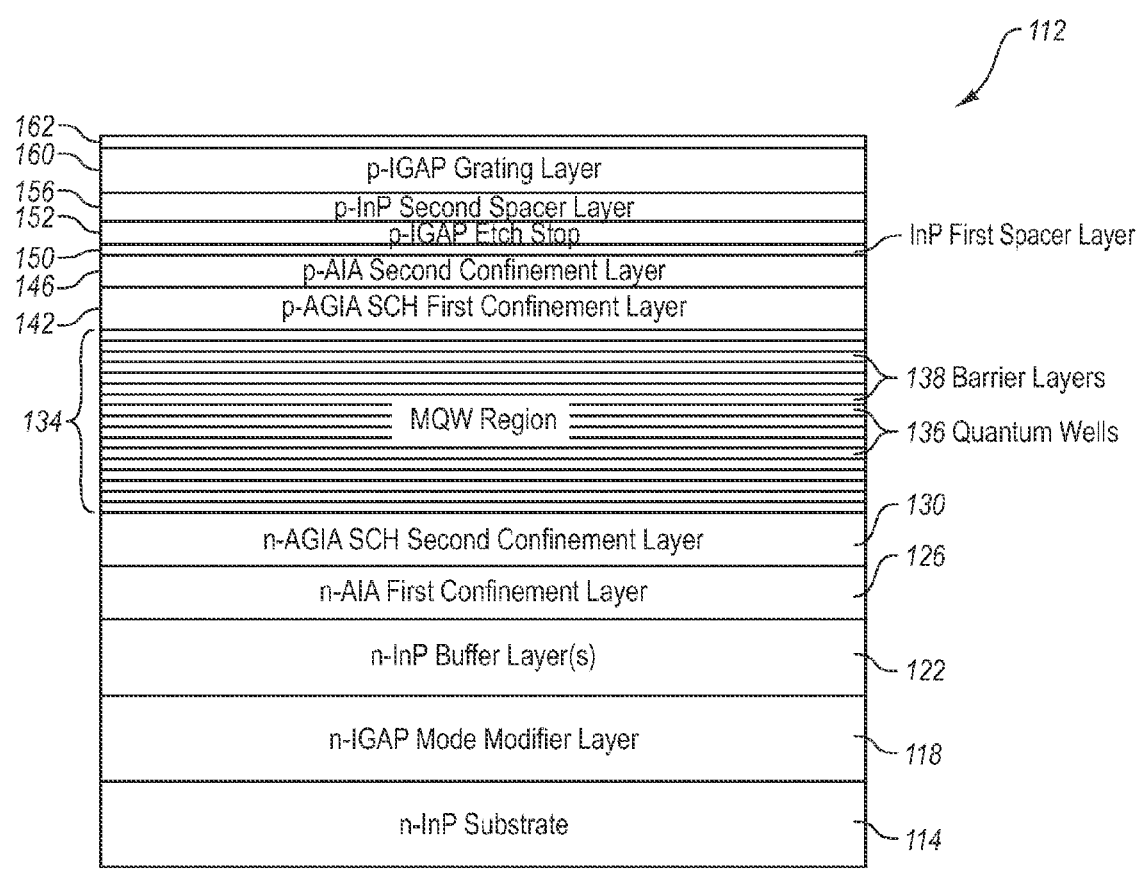
FIG. 2 is a cross sectional side view of an epitaxial base portion of a distributed feedback ("DFB") laser suitable for treatment by the present method, according to one embodiment.
Figure 3:
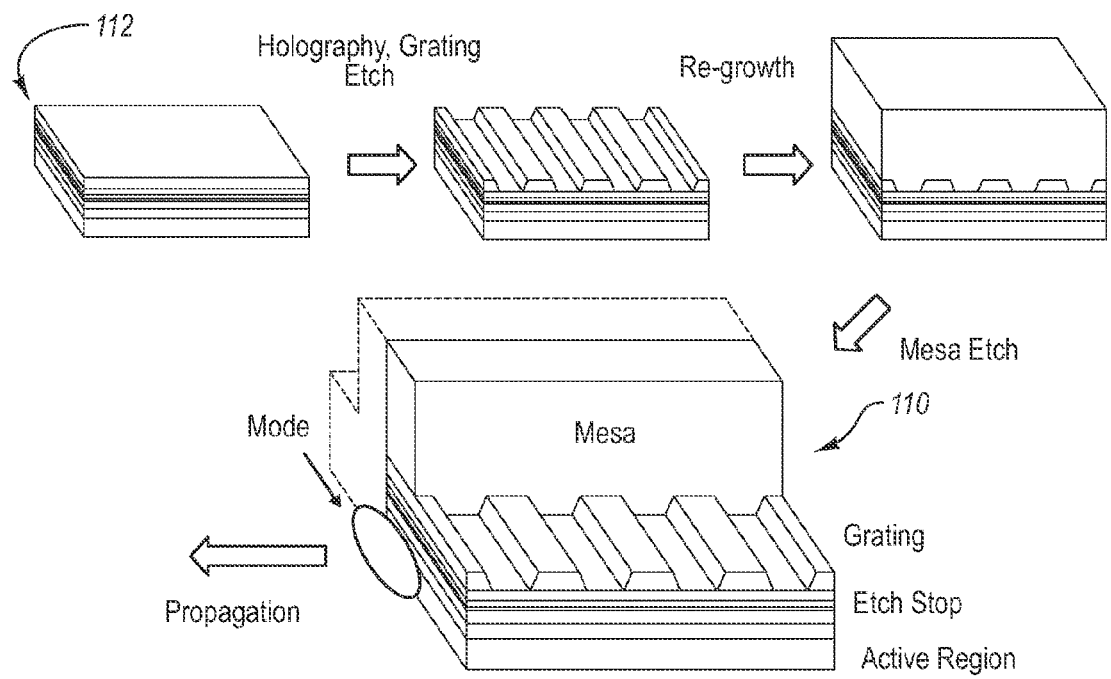
FIG. 3 is a progressive view of various processing and manufacturing stages performed on the epitaxial base portion shown in FIG. 2 and related to the present method, according to one embodiment.

Together with FIG. 1, reference is now made to FIGS. 2 and 3. In general, the operating environment described above, including the transceiver 100 and TOSA 20, is exemplary of one environment in which a laser device produced in part according to principles of the present invention can be employed. In particular, embodiments of the present invention disclose a method for applying coatings to the facets of a laser, such as a distributed feedback or Fabry-Perot laser in such a way as to protect the facets from damage.

As already mentioned, a distributed feedback ("DFB") laser is one example of a semiconductor optical device benefiting from practice of embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way.

a. Base Epitaxial Layers

FIG. 2 illustrates layers of a base epitaxial portion 112 of a 10 G DFB laser, generally designated at 110 in FIG. 3, at a stage prior to etching of the grating layers. The base epitaxial portion 112 of the DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. The mode modifier layer 118 functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 µm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated," which means that the barriers 138 are designed to have opposing strain characteristics relative to the strain characteristics of the quantum wells 136. As a result, the strain generated from the barriers 138 at least partially cancels the strain generated by the quantum wells 136 and reduces the overall strain on the MQW region 134. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode 110 always occurs in the same place, and is not made variable by unpredictable dopant diffusion processes. Further details regarding the doping of the MQW region 134 will be given further below.

A first p-confinement layer 142 of Aluminum Gallium Indium Arsenide (p-AGIA SCH) is grown on the active region at a thickness of 30 nm and is doped with zinc. A second p-confinement layer 146 of Aluminum Indium Arsenide (p-AIA) is grown at a thickness of 20 nm on the p-AGIA SCH layer and is also doped with zinc. Both of the p-layers are confinement layers and effectively maintain holes within the active region so that photons are produced. The p-AGIA SCH first confinement layer 142 is graded to improve the confinement characteristics of the layer. The thicknesses of these p-layers were designed to be thin in order to optimize the speed and thermal performance of the laser.

A first spacer layer 150 is located above the p-confinement layers 142 and 146. The first spacer layer 150 is made of Indium Phosphide and is approximately 5 nm in thickness. The thinness of the first spacer layer 150 improves the coupling efficiency of the grating and improves the speed of the laser 110. In particular, the first spacer layer 150 effectively controls the degree to which lateral current spreading occurs between the bottom of the ridge mesa and the active region 134.

Various "above-active" grating layers are located above the first spacer layer 150. An etch stop layer (p-IGAP) 152 made of Indium Gallium Arsenide Phosphide and, having a thickness of 15 nm, is grown on the spacer layer 150. The etch stop layer 152 is provided for stopping the mesa etch.

A second spacer layer 156 is provided to separate the etch stop layer 152 and a grating layer, described below. In the illustrated design, a grating etch procedure is timed to stop within the second spacer layer 156. The second spacer layer 156 layer is made of Indium Phosphide (p-InP) at a thickness of 25 nm.

A grating layer (p-IGAP) 160 is grown on the second spacer layer 156 and is made of Indium Gallium Arsenide Phosphide at a thickness of 30 nm. The grating layer 160 is "above active" (as compared to other possible designs in which the grating is below the active region). Laser holography, wet etching, and subsequent InP regrowth, as explained further below, are used to create a uniform grating in the grating layer 160, consisting of alternating layers of high index IGAP and low index InP down a length of the laser cavity.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed. The top layer 162 is a thin layer of Indium Phosphide.

b. Grating Fabrication and Regrowth

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth steps in forming the DFB laser 110. As described above and by way of brief overview, a wet etch is performed to etch periodic gaps within the grating layer, as shown in FIG. 3. After the etch is completed and the grating teeth are created, thick Indium Phosphide is grown ("regrowth") on the etched, base epitaxial structure, in order to fill the gaps with low-index InP and also to form the mesa layer, also shown in FIG. 3. The regrowth is completed with an Indium Gallium Arsenide layer for electrical contact.

As mentioned above, the Indium Phosphide regrowth is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth, thereby defining the mesa of the DFB laser. Both dry and wet etching can be used in creating the mesa ridges.

After the etching process is complete, a dielectric layer (not explicitly shown) is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa. In other embodiments, a single layer of Silicon Nitride or Silicon Oxide can be employed for the dielectric layer.

The dielectric layer is removed from the top of the mesa to allow an electrical contact and metallic layer (not shown) to be placed on the mesa. Electrical contact is made by depositing metal onto the Indium Gallium Arsenide layer at the top of the mesa. This contact is both a non-alloy contact and a low penetration contact.

A metallic layer (not shown) is placed on the electrical contact to which electrical current may be provided to the laser structure. In the present embodiment, the metallic layer is made of three sub-layers of titanium, platinum and gold. The titanium sun-layer is placed directly on the electrical contact layer, then the platinum sub-layer and gold sub-layer are applied. This metallic layer provides sufficient conductivity to the Indium Gallium Arsenide layer so that current can be properly provided to the laser structure.

Bottom electrical contacts are generated by thinning the InP substrate and placing an n-type metallic layer (not shown) on the bottom.

A DFB laser is removed from a wafer using common techniques by cleaving and breaking the wafer both horizontally and laterally to separate each laser. After this process, anti-reflective ("AR") and high-reflective ("HR") coating processes are performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which optically couples with an optical fiber. A minority of the optical power is emitted from the back of the laser, which may couple with a photodetector (not shown) that is used to monitor laser performance.

In one embodiment, the AR and HR coatings are made of layers of Silicon Oxide and Silicon. The reflectivity of the AR coating is designed to be less than about 0.5%, while the HR coating is designed to be higher than about 90%. Once the coating process is complete, a testing process is performed in which the power characteristics and optical spectrum are tested.

The DFB laser 110 and photodetector are packaged into an optical sub-assembly, such as the TOSA 20 shown in FIG. 1, which is subsequently packaged into an optical module, e.g., the transceiver 100 of FIG. 1, along with driver and control integrated circuits.

c. Laser Facet Protection

Figure 4:
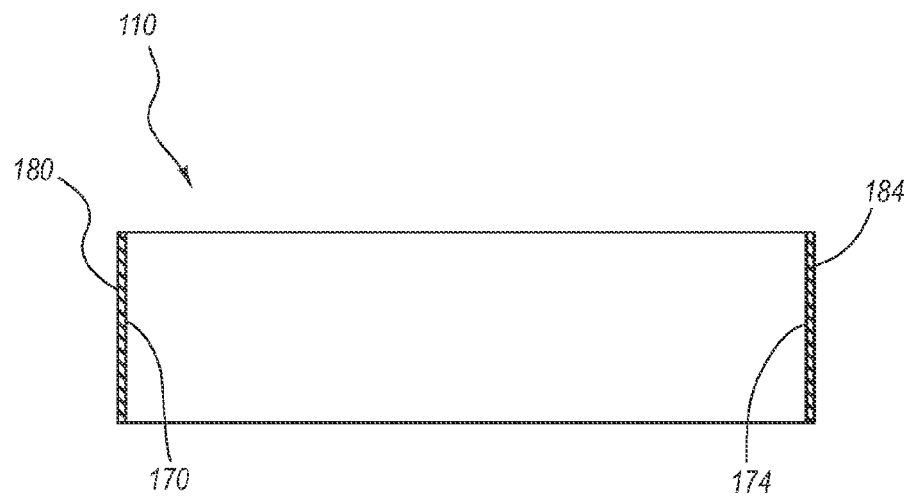
FIG. 4 is a side view of a laser similar to that shown in FIG. 3, showing facet coatings applied according to one embodiment of the present invention.

Together with FIGS. 2 and 3, reference is now made to FIG. 4, which depicts a laser, such as the laser 110 discussed above, having coated facets, in accordance with one embodiment. In particular, the laser 110 includes a front facet 170 and a rear facet 174. As shown, the front facet 170 includes a coating 180 deposited thereon. Similarly, the rear facet 174 includes a coating 184 deposited thereon. As described above, the coatings 180 and 184, e.g., AR and HR coatings, are employed to impart certain reflectivity characteristics to the facets 170 and 174, respectively. The coatings may be the same or different, according to the particular characteristics desired.

Figure 5:
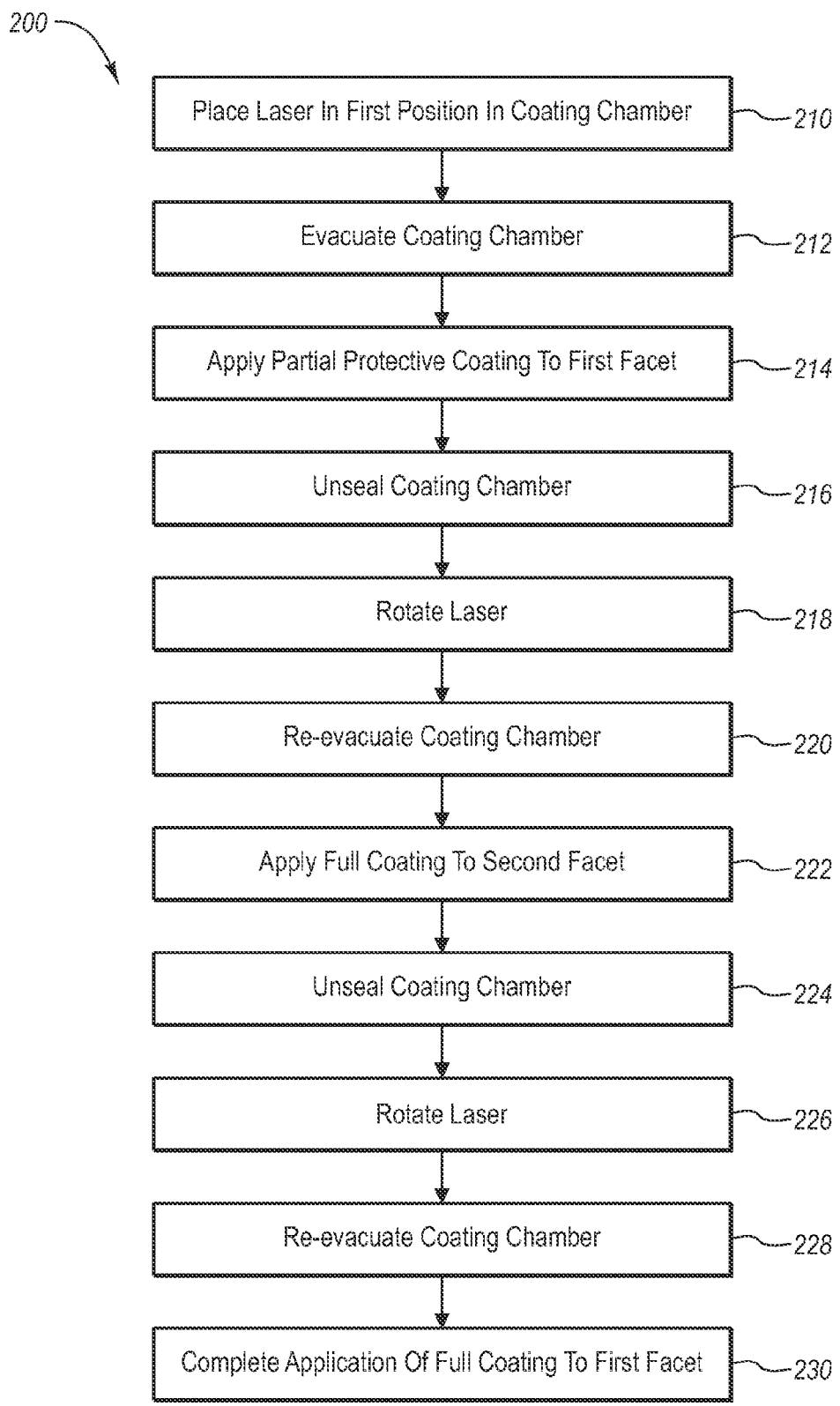
FIG. 5 is a flow diagram showing various stages of a method for applying laser facet protective coatings, according to one embodiment of the present invention.

In accordance with one embodiment, a method, generally designated at 200 in FIG. 5, is followed in order to deposit a portion of the coatings 180 and 184 on the respective facets 170 and 174 so as to protect them during the coating process. As a result of this method, damage to the facets is minimized during the coating process.

In a first stage 210 of the method according to one embodiment, the laser 110 is placed in a first position within a coating chamber, which chamber is then evacuated at stage 212. In stage 214, once vacuum is achieved in the coating chamber a partial, protective coating is applied to one of the facets of the laser 110, such as the first facet 170. The protective coating in the present embodiment is composed of a thin layer of the coating 180 that will be eventually applied to the first facet 170 in full thickness in a subsequent stage. As such, the protective coating is composed of the same material of which the rest of the coating 180 is composed. In another embodiment, however, it is appreciated that the protective coating can differ in composition from the rest of the coating 180 or 184.

For instance, the protective coating—as well as the rest of the coating 180—can be composed of one or more of various materials, including dielectric oxides, aluminum oxides, silicon oxides, silicon nitride, titanium oxide, and silicon. Generally, desired coating characteristics include a refractive index that is commensurate with the desired facet refractive index, and a low level of crystal structure mismatch between the coating and the facet surface.

The protective coating portion of the coating 180 is deposited on the facet 170 at a relatively low beam voltage (also referred to herein as "coating energy") of about 400 V using ion beam deposition and having a relatively thin thickness, such as within the range of approximately 50-500 Angstroms. If desired, beam voltages of up to about 600 V could also be employed. Deposition of the protective coating portion occurs via an ion beam process for a period of about 30 minutes in one embodiment. In other embodiments, of course, the thickness, deposition time and application method can vary according to the needs of the particular application. However, use of a low beam voltage process for a relatively short amount of time assists in reducing damage to the as-yet untreated second facet 174, also contained in the coating chamber, as few high energy particles are present therein. In another embodiment, e-beam evaporation can be employed to deposit the coating portions discussed herein.

After formation of the protective coating portion of coating 180 (stage 214) is complete, the chamber vacuum is released in stage 216, and the chamber opened in order to rotate the laser bar 110 approximately 180 degrees in stage 218. By virtue of its protective coating, the first facet 170 suffers little, if any, damage from exposure to oxygen during this stage.

Once the wafer has been rotated (stage 218), the chamber is re-sealed and evacuated in stage 220. The second facet 174 is then fully coated in stage 222 in order to completely form the coating 184 (FIG. 4). This process can begin with a low deposition beam voltage and subsequently move to higher beam voltages in order to form the coating 184, thereby minimizing damage to the second facet 174. However, because the first facet 170 has been previously treated with a protective layer, i.e., a portion of the front facet coating 180, damage to the first facet is substantially reduced. The coating process for the second facet 174 can last from two to five or more hours until complete. Again, the coating application process and particular coatings used can be similar to that described above in connection with the coating 180 to the first facet 170, or can differ as may be appreciated by one skilled in the art.

Once the coating 184 has been fully applied to the second facet 174, the chamber is once again released from vacuum in stage 224, and the laser 110 rotated another 180 degrees in stage 226. The coating chamber is again evacuated in stage 228. Completion of formation of the coating 180 on the first facet 170 can then proceed in stage 230 under normal high energy conditions until complete, usually two to five or more hours. Once the method has been completed, the laser can be removed from the coating chamber and further processed as needed.

Figure 6:
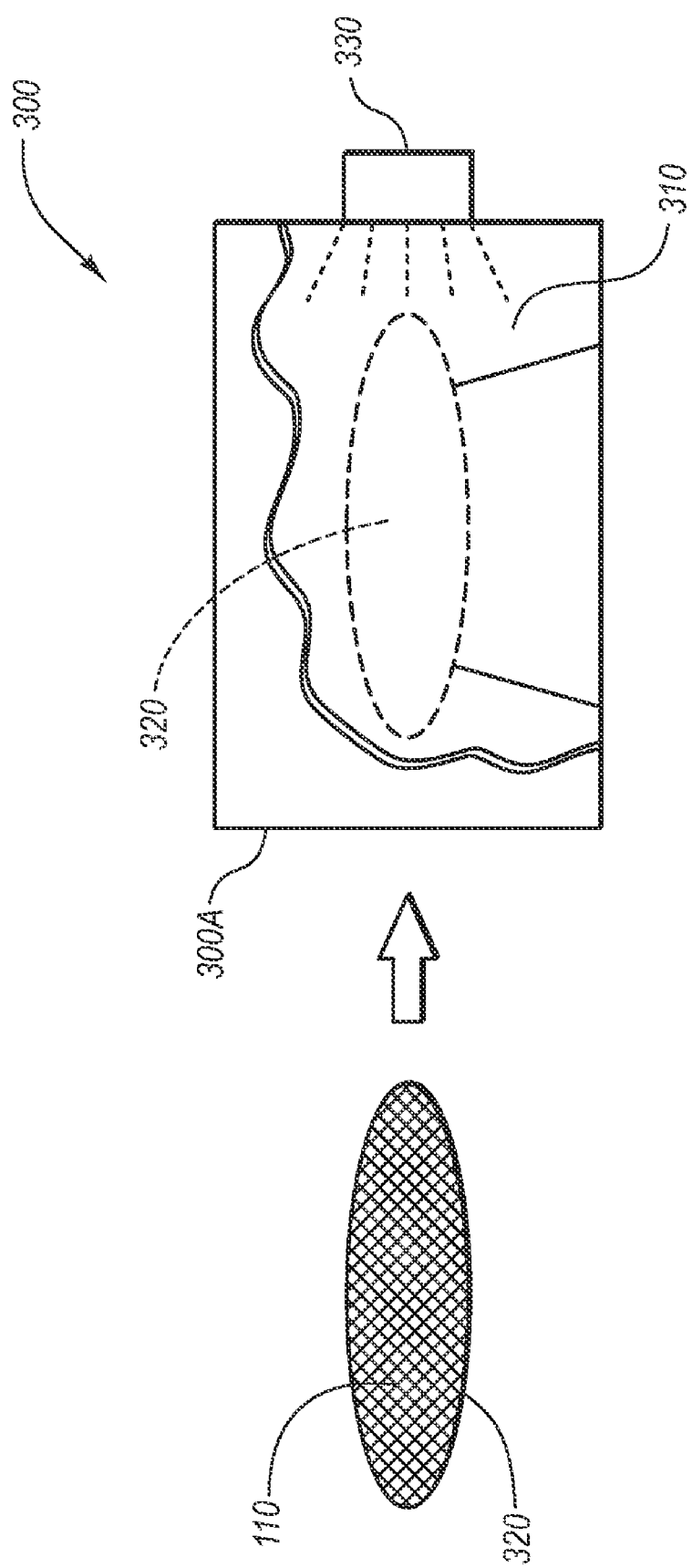
FIG. 6 is a simplified diagram showing a wafer and coating chamber used in accordance with one embodiment of the present invention.

FIG. 6 depicts in simplified form a system for applying protective coatings to laser dies, in accordance with one embodiment. In particular, a coating chamber 300 is shown, having an interior volume 310 where a wafer, such as the wafer 320 containing a plurality of laser dies 110, is positioned during coating, together with a door 300A. A coating source 330 is included at one end of the coating chamber 300. Note that the coating system shown in FIG. 6 is exemplary only, and can vary from what is described herein.

Practice of this method advantageously improves part yield during manufacture by significantly reducing the amount of facet damage inflicted by high energy particles in the coating chamber as a result of the as-yet uncoated facet having no protective coating for the entire time required to fully coat the other facet. Moreover, it is believed that laser performance and reliability are also enhanced by practice of embodiments of the present invention.

In accordance with alternative embodiments of the present invention, variations to the above method can occur while still falling within the claims of the present invention. For one, coating as described above can be performed on individual lasers or on multiple lasers arranged in bars. The method can also be practiced over a range of coating temperatures without negative effects to the process being manifested.

In one alternative embodiment, both facets of the laser can first be coated with a protective coating before full coating either of the two facets. Also, in another embodiment, an advanced coating chamber can be employed, wherein the laser can be rotated between facet coatings without having to break the vacuum within the chamber, thereby speeding coating time. These and other modifications are therefore contemplated as falling within the scope of the present invention.

Note also that, while referring to the laser as being included on a wafer during the described protective coating method, the method can also acceptably be practiced on lasers in other configurations, including laser bars and singulated laser dies.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A method for coating first and second facets of an optical device, the method comprising:
    beaming onto the first facet an ion beam having a first energy so as to coat the first facet with a protective layer of a first material, which protective layer is only a portion of a full thickness of a full first coating, wherein the protective layer is formed in a chamber;
    rotating the optical device in the chamber about 180 degrees;
    beaming onto the second facet an ion beam so as to fully coat the second facet with all layers of a second coating to provide full thickness of the full second coating as one of an anti-reflective coating or a high-reflective coating, at least a portion of the layers of the second coating being applied with the ion beam having a second energy that is higher than the first energy in the chamber;
    rotating the optical device in the chamber about 180 degrees; and
    beaming onto the protective player an ion beam at a third energy so as to coat the protective layer of the first facet with additional layers of the first material in order to form the full thickness of the full first coating as the other of the anti-reflective coating or high-reflective coating, wherein the additional layers are applied at the third energy that is higher than the first energy in the chamber.

2. The method for coating as defined in claim 1, wherein the first full facet coating is completed at the third energy being the same as the second energy.

3. The method for coating as defined in claim 1, wherein all of the second coating layers are applied to the second facet at the second energy.

4. The method for coating as defined in claim 1, wherein the optical device is a ridge waveguide laser.

5. The method for coating as defined in claim 1, wherein the first energy is approximately 400 volts.

6. The method for coating as defined in claim 1, wherein fully coating the second facet further comprises:
    partially coating the second facet with one or more layers of the second coating at the first energy; and
    completing coating of the second facet with one or more layers of the second coating at the second energy.

7. The method for coating as defined in claim 1, wherein the first and second coatings have crystal structures that are not substantially mismatched with the first and second facets.

8. The method for coating as defined in claim 1, wherein the optical device is rotated within a coating chamber without breaking vacuum in the chamber between coating the first and second facets.

9. The method for coating as defined in claim 1 wherein the coating chamber retains a vacuum during rotations of the optical device.

10. The method for coating as defined in claim 1, wherein the ion beam is applied for about 30 minutes to form the protective coating having a dimension of 50-500 Angstroms.

11. A method for depositing coatings on facets of a laser, the method comprising:
    placing the laser in an evacuated coating chamber;
    applying a first protective layer to a first facet of the laser with an ion beam;
    rotating the laser within the coating chamber;
    applying all layers of a second full coating to a second facet of the laser with an ion beam, the second full coating being one of an anti-reflective coating or a high-reflective coating;
    again rotating the laser; and
    applying additional layers of a full coating atop the first protective layer on the first facet of the laser to form a first full coating with an ion beam, the first full coating being the other of the anti-reflective coating or high-reflective coating.

12. The method for depositing as defined in claim 11, wherein the first protective layer is applied at a coating energy that is less than the coating energy used to apply at least a portion of the second full coating to the second facet of the laser.

13. The method for depositing as defined in claim 12, wherein the first protective layer is applied such that damage to the second facet of the laser is controlled.

14. The method for depositing as defined in claim 13, wherein the first protective layer serves as a protective surface for the first facet during applying all the layers of the second full coating.

15. The method for depositing as defined in claim 11, wherein the first protective layer is applied at a coating energy of about 400 volts.

16. The method for depositing as defined in claim 15, wherein the first protective layer is applied having a thickness within a range from approximately 50 to 500 Angstroms.

17. The method for depositing as defined in claim 16, wherein the layers of the full coatings of the first and second facets are selected from the group consisting of: dielectric oxides, aluminum oxides, silicon oxides, silicon nitride, titanium oxide, and silicon.

18. The method for depositing as defined in claim 17, wherein the coating chamber is evacuated after each rotation of the laser.

19. The method for depositing as defined in claim 11, wherein the first coating energy is less than approximately 600 volts.

20. The method for depositing as defined in claim 11, wherein the second full coating is applied to the second facet of the laser before rotating the laser the second time and applying the additional layers of the first full coating atop the first protective layer to the first face of the laser after rotating the laser the second time.

* * * * *